United States Patent [19]

Ohba et al.

[11] Patent Number: 5,138,353
[45] Date of Patent: Aug. 11, 1992

[54] PHOTO-SENSITIVE PRINTING PLATE PROCESSING APPARATUS

[75] Inventors: Hisao Ohba; Hiroshi Matsumoto; Kenji Kunichika, all of Shizuoka, Japan

[73] Assignee: Fuji Photo Film Co., Ltd., Kanagawa, Japan

[21] Appl. No.: 367,414

[22] Filed: Jun. 16, 1989

[30] Foreign Application Priority Data

Jun. 17, 1988 [JP] Japan .................. 63-149421

[51] Int. Cl.⁵ .................. G03B 3/06; G03B 3/08
[52] U.S. Cl. ........................... 354/322; 354/325
[58] Field of Search ............ 354/320, 321, 322, 324, 354/325

[56] References Cited

U.S. PATENT DOCUMENTS 3,589,261 6/1971 Krikelis ............... 354/322
4,464,035 8/1984 Schoering ............ 354/322

FOREIGN PATENT DOCUMENTS 6035072 8/1978 Japan .

Primary Examiner—A. A. Mathews
Attorney, Agent, or Firm—Sughrue, Mion, Zinn, Macpeak & Seas

[57] ABSTRACT

A photo-sensitive printing plate processing apparatus for processing a photo-sensitive printing plate upon which an image has been exposed is provided wherein, adjacent to a main developing tank where the photo-sensitive printing plate is conveyed, immersed in developing solution and developed, on either the upstream or downstream side with respect to the direction of conveyance of the photo-sensitive printing plate, an auxiliary developing tank is provided for applying developing solution to the photo-sensitive printing plate and performing auxiliary developing thereof and therefore allowing definite developing of the photo-sensitive printing plate to be achieved.

11 Claims, 2 Drawing Sheets

PHOTO-SENSITIVE PRINTING PLATE PROCESSING APPARATUS

BACKGROUND OF THE INVENTION

The present invention relates to a photo-sensitive printing plate processing apparatus for processing photo-sensitive printing plates upon which an image has been exposed.

DESCRIPTION OF THE RELATED ART

Such a photo-sensitive printing plate as a presensitized offset plate upon which an image has been exposed, is sent to a photo-sensitive printing plate developing apparatus, in which the photo-sensitive printing plate is developed in a developing tank, washed in a rinsing or washing tank, and then has finisher solution applied in the rinsing tank or a desensitizing tank.

The developing solution is supplied inside the developing tank and the photo-sensitive printing plate is conveyed into the developing tank, where developer solution is sprayed onto the surface of the photo-sensitive plate and developing is performed. In a known type of developing apparatus, such as that disclosed in Japanese Patent Laid-Open No. 35072/1985, the process of developing is divided into at least two developing processes and the developing time is changed in multiple stages. Moreover, the developing solution, fatigued due to developing the PS plates, is caused to overflow from the developing tank and discharged when a replenishing developing solution is added in the developing tank from a replenishing device.

However, in the developing apparatus described in Japanese Utility Model No. 35072/1985, there is a large difference in the developing performance of the developing solution between instances where the number of the photo-sensitive printing plates which have been processed is small, and when it is great. There are differences in the developing processing of the photo-sensitive printing plates processed when the number of plates which have been processed is small, and when the number is large, and stable developing processing is not able to be performed. Moreover, there are also instances where development differs according to the type of the photo-sensitive printing plate, and it is not possible to stabilize the developing processing to correspond to this.

One potential means of alleviating these above-described differences in the development process has been to increase the speed of rotation of brushes and to increase the spray amounts. However, developing solution is dispersed by the spays and rotation of the brushes, and adheres to the inner walls of the developing apparatus so that periodic cleaning is necessary. Moreover, in some cases, foaming of the developing solution occurs so that foam overflows from the developing tank to render continuous processing impossible.

The present invention has been achieved in light of the above-described facts, and an object of the present invention is to provide a photo-sensitive printing plate developing apparatus that can stably process different types of photo-sensitive printing plates and that can perform the necessary amount of processing stably.

SUMMARY OF THE INVENTION

To this end, the present invention is a photo-sensitive printing plate processing apparatus for processing a photo-sensitive printing plate upon which an image has been exposed. The apparatus has: an immersion type main tank to which the photo-sensitive printing plate is conveyed and in which it undergoes developing processing. An auxiliary developing tank is disposed adjacent to the immersion type main developing tank on at least either the upstream or downstream side with respect to the direction of conveyance of the photo-sensitive printing plate, for applying developing solution to and performing auxiliary developing of the photo-sensitive printing plate.

In the present invention having the above-described configuration, when the auxiliary developing tank is disposed on the upstream side with respect to the direction of conveyance of the photo-sensitive printing plate, for example, the photo-sensitive printing plate upon which an image has been exposed, is conveyed to the auxiliary developing tank, where the developable surface of the photo-sensitive printing plate is made to swell with a developing solution and undergo auxiliary developing. After this processing, it is conveyed into the immersion type main developing tank and developed.

Moreover, in another example, the photo-sensitive printing plate is conveyed to the immersion type main developing tank where the major part of the developing of the photo-sensitive printing plate is performed, and is then conveyed to the auxiliary developing tank where the end parts and other still not completely developed parts of the photo-sensitive printing plate are completely developed.

In this manner, the photo-sensitive printing plate can either undergo auxiliary developing in the auxiliary developing tank prior to undergoing developing in the immersion type main developing tank, or it can undergo developing for the major portion in the immersion type main developing tank prior to undergoing finishing developing in the auxiliary developing tank. As a result, the degree of fatigue of the developing solution in the main developing tank and the developing solution in the auxiliary developing tank is lessened. Also, it is also possible to make the developing tank smaller so that the amount of $CO_2$ gas in the atmosphere and the area of developing solution in contact with the atmosphere are decreased to lessen the degree of deterioration of the developing solution. Because of this, the degree of lessening of the developing performance of the developing solution in the developing tank and the processing performance of the developing solution in the auxiliary tank can be decreased even when a large number of plates are processed. Other advantages of such a configuration are that there is no dispersal or foaming of the developing solution and that stable developing processing of the photo-sensitive printing plate can be achieved.

Furthermore, the development process can be further improved by providing a member for rubbing the photo-sensitive printing plate in the immersion main developing tank of the auxiliary developing tank depending upon the type of photo-sensitive printing plate to be processed. Moreoever, photo-sensitive printing plates having good development characteristics can be conveyed directly to the main developing tank without passing through the auxiliary developing tank so as to enable developing of different types of photo-sensitive plates.

DESCRIPTION OF THE PREFERRED EMBODIMENT

Embodiment 1

Figure 1:
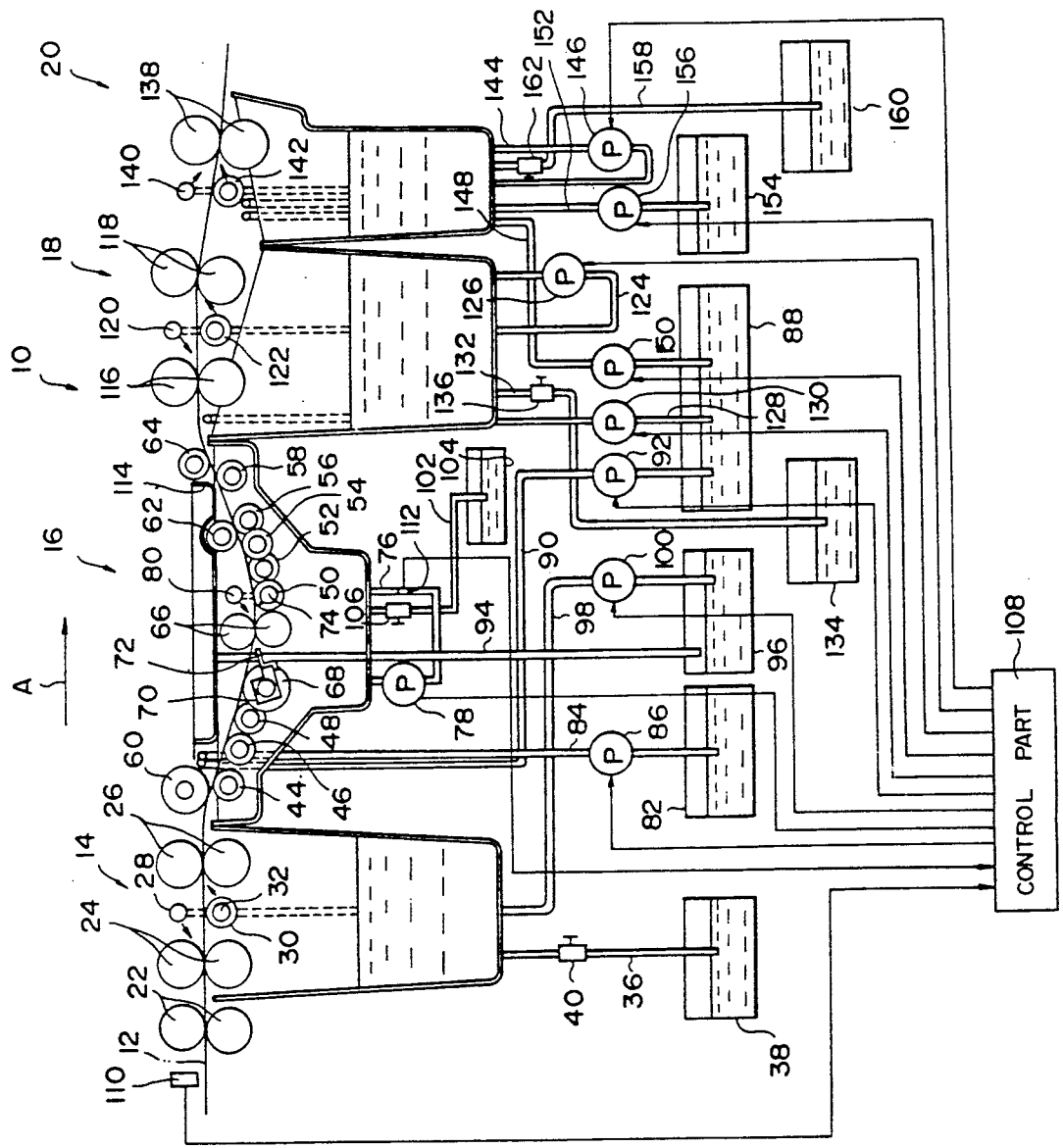
FIG. 1 is a schematic view showing a first embodiment of a photo-sensitive printing plate processing apparatus according to the present invention.

FIG. 1 shows a first embodiment of a photo-sensitive printing plate processing apparatus according to the present invention.

A photo-sensitive printing plate processing apparatus 10 is provided with an auxiliary developing tank 14 for performing auxiliary developing of a presensitized offset plate 12 (hereinafter termed a "PS plate") upon which an image has been exposed by a printing apparatus not indicated in the figure, an immersion type main developing tank 16 (hereinafter termed the "main developing tank") for performing the final developing processing of the PS plate 12, a washing tank 18 for washing off developing solution adhering to the PS plate 12, and a rinse processing tank or desensitization processing tank 20 for applying either rinsing solution or desensitizing solution to the PS plate 12.

As is indicated in FIG. 1, a pair of conveying rollers 22 are disposed on the side of the auxiliary developing tank 14 from which the PS plate 12 is inserted. The PS plate 12 upon which an image has been exposed is inserted to this pair of conveying rollers 22 by the printing apparatus not indicated in the figure.

At an upper portion of the auxiliary developing tank 14 are disposed pairs of conveying rollers 24 and 26 in order and along the direction of conveyance of the PS plate 12 (indicated by the arrow A). These pairs of conveying rollers 24 and 26 span between and are rotatably supported by a pair of side walls (not indicated) of the auxiliary developing tank 14. Also, the drive force of a drive means not indicated in the figure is transmitted to rotate these pairs of conveying rollers 24 and 26 so as to convey the PS plate 12 substantially horizontally (and in the direction of the arrow A).

Between the pair of conveying rollers 24 and the pair of conveying rollers 26 are disposed a spray pipe 28 and a guide roller 30 above and below the conveying path, respectively. The spray pipe 28 and the guide roller 30 are disposed so that their axes cross the PS plate 12 across its width.

The spray pipe 28 is formed so as to have multiple spray outlets (not indicated in the figure) along its length and open towards the conveying rollers 24. The developing solution in the auxiliary developing tank 16 to be described in detail later is supplied to the spray pipe 28.

The guide roller 30 also has multiple spray nozzles along the length of its shaft formed by a spray pipe 32, which supports around its periphery multiple rotating rollers of a flexible material. The guide roller 30 is therefore both a spray pipe, and a split roller type of guide roller. The developing solution in the main developing tank is supplied to the guide roller 30.

Accordingly, while the PS plate 12 is being held and conveyed by the pairs of conveying rollers 24 and 26, the spray pipe 28 and the spray pipe 32 that forms the shaft of the guide roller 30 apply developing solution to both sides of the PS plates 12. Also, excess developing solution is collected at the bottom of the auxiliary developing tank 14.

The auxiliary developing tank 14 is connected by a pipe 36 to a waste liquid tank 38, and a valve 40 is disposed along the pipe 36 so that opening this valve 40 allows the excess developing solution that has collected at the bottom of the auxiliary developing tank 14 to be discharged to the waste liquid tank 38.

Adjacent to the auxiliary developing tank 14 on the downstream side with respect to the direction of conveyance of the PS plate 12 is disposed the main developing tank 16. The upper part of the main developing tank 16 is open and the bottom and middle parts of the tank narrow towards the bottom. This main developing tank 16 contains developing solution as processing solution. Inside the main developing tank 16 are disposed guide rollers 44, 46, 48, 50, 52, 54, 56 and 58 of the same diameter, and so as to follow the bottom of the tank. These guide rollers 44, 46, 48, 50, 52, 54, 56 and 58 are formed as split rollers having flexible rotating members supported by their shafts, and span between and are rotatably supported by a pair of side walls (not indicated in the figure) of the main developing tank 16.

Furthermore, above the guide roller 44 is disposed a large-diameter guide roller 60, above the guide roller 56 is disposed a guide roller 62, and above the guide roller 58 is disposed a guide roller 64. These guide rollers 60, 62 and 64 are supported by the two side walls (not indicated in the figure) in the same way as are the guide rollers 44, 46, 48, 50, 52, 54, 56 and 58.

In the middle part of the main developing tank 16 and between the guide roller 50 and the guide roller 48 is disposed a pair of conveyor rollers 66. This pair of conveying rollers 66 are supported by the pair of side walls (not indicated in the figure) and the drive force of a drive means (not indicated in the figure) is transmitted to rotate it.

Between the pair of conveying rollers 66 and the guide roller 48 is disposed a guide roller 68 having a larger diameter than the guide roller 48. This large-diameter guide roller 68 is a split roller that is supported by the pair of side walls (not indicated in the figure) in the same manner as are the guide rollers 44, 46, 48, 50, 52, 54, 56 and 58. The shaft of this large-diameter guide roller 68 is provided with a guide 72 by means of a bracket 70. This guide 72 has one end fixed in the bracket 70 and the other end is disposed in the direction of the pair of conveying rollers 66 so that the PS plate 12 is guided between the pair of conveying rollers 66.

Accordingly, the PS plate 12 sent from the auxiliary developing tank 14 by the pair of conveying rollers 26, passes between the guide roller 44 and the guide roller 60, is guided downwards at an oblique angle by the guide rollers 46, 48 and 68, and is inserted to between the pair of conveying rollers 66. After the PS plate 12 has passed through the pair of conveying rollers 66, it is guided upwards at an oblique angle by the guide rollers 50, 52, 54, 56 and 60, is guided by the guide roller 64 and sent to the washing tank 18. By this arrangement, the PS plate 12 is immersed in and developed by the developing solution in the main developing tank 16.

The guide roller 50 is formed in the same manner as the guide roller 30 in that a plurality of spray nozzles are opened along the length of its shaft formed by a spray pipe 74, which supports around its periphery a plurality of rotating rollers of a flexible material. The guide roller 50 is connected at one end to a pipe 76. The other end of the pipe 76 opens into the bottom of the main developing tank 16 and a circulation pump 78 is disposed along the pipe 76 to supply the developing solution in the main developing tank 16, to the guide roller 50.

Moreover, disposed above guide roller 50 is a spray pipe 80. Along the shaft of this spray pipe 80 are a plurality of spray nozzles opened in the direction of the pair of the conveying rollers 66. The spray pipe 80 is also connected to the pipe 76 and the developing solution in the main developing tank 16 is supplied to it by the circulation pump 78.

Emptying into the main developing tank 16 is a pipe 84 connected to the developing solution replenishing tank 82. Disposed along this pipe 84 is a supplemental solution pump 86. Furthermore, also emptying above the main developing tank 16 is a pipe 90 connected to a water supply tank 88. Disposed along this pipe 90 is a water supply pump 92. Through this arrangement, the development replenishing solution (concentrated) in the development replenishing solution tank 82 and the water in the water supply tank 88 are supplied to the main developing tank 16 in a predetermined proportion.

Moreover, one end of a pipe 94 passes through the bottom of the main developing tank 16 to protrude into the main developing tank 16 and the other end of this pipe 94 empties into an overflow solution recovery tank 96 so that overflowing solution is recovered. The amount that the pipe 94 protrudes into the main developing tank 16 is therefore equal to the level of the developing solution in the main developing tank 16.

One end of a pipe 98 is disposed in the overflow solution recovery tank 96, and the other end is connected to the spray pipe 28 and the guide roller 30. Along this pipe 98 is disposed a supply pump 100. Through this arrangement, the developing solution that has overflowed out of the main developing tank 16 is supplied to the spray pipe 28 and the guide roller 30 by the supply pump 100.

Furthermore, one end of a drainage pipe 102 is open to the bottom of the main developing tank 16 and the other end of this drainage pipe 102 is connected to a drainage tank 104. Located along this drainage pipe 104 is a valve 106. The circulation pump 78, the replenishing solution pump 86, the water supply pump 92 and the supply pump 100 are connected to and their drive controlled by a control part 108 provided on the photo-sensitive printing plate processing apparatus 10.

The insertion side of the pair of conveying rollers 22 is provided with a detector 110 connected to the control part 108. This detector 110 detects the time the PS plate 12 takes to pass the insertion inlet of the photo-sensitive printing plate processing apparatus 10, and the control part 108 calculates the area of the PS plate 12 inserted into the photo-sensitive printing plate processing apparatus 10 on the basis of the time detected, a preset PS plate processing speed and PS plate width.

Also, along the pipe 76 is a fatigue detector 112 that measures the impedance of the developing solution and therefore determines the degree of fatigue of the developing solution. This fatigue detector 112 is also connected to the control part 108.

The surface of the developing solution in the main developing tank 16 is covered by a floating cover 114 which prevents deterioration of the developing solution due to the gaseous $CO_2$ in the air being absorbed to neutralize the alkali component of the developing solution.

On the downstream side with respect to the direction of conveyance of the PS plate 12, and at the upper portion of the washing tank is disposed a pair of conveying rollers 116 and a pair of conveying rollers 118. A pair of squeeze rollers may be disposed at the outlet of the main developing tank. The pair of conveying rollers 116 and the pair of conveying rollers 118 are supported by a pair of side plates not indicated in the figure, and the drive force of a driving means also not indicated in the figures is transmitted to rotate them.

Between the pair of conveying rollers 116 and the pair of conveying rollers 118 are disposed a spray pipe 120 and a guide roller 122 similar to the spray pipe 28 and the guide roller 30 disposed in the auxiliary developing tank 14.

The spray pipe 120 and the guide roller 122 are connected to one end of a pipe 124. The other end of the pipe 124 passes through the bottom of the washing tank 18 and protrudes into the washing tank 18. A circulation pump 126 is disposed along the pipe 124 to supply the water in the washing tank 18 to the spray pipe 120 and the guide roller 122, and therefore supply it to both surfaces of the PS plate 12.

One end of a pipe 128 is disposed in the water tank 88 and the other end empties into the washing tank 18. Disposed along this pipe 128 is a water supply pump 130, and the water in the water tank 88 is supplied to the top part of the washing tank 18 by the water supply pump 130.

Furthermore, the bottom of the washing tank 18 is open to one end of a drainage pipe 132 and the other end of this drainage pipe 132 is open to a discharge liquid tank 134. Located along this drainage pipe 132 is a valve 136 and by opening this valve 136, the water in the washing tank 18 is discharged to the discharge liquid tank 134.

The circulation pump 126 and the water supply pump 130 are connected to and their operation controlled by the control part 108.

Above the rinsing processing or desensitization processing tank 20 (hereinafter termed the "desensitization processing tank 20") disposed on the side of the washing tank 18 downstream with respect to the direction of conveyance of the PS plate 12, is disposed a pair of conveying rollers 138. This pair of conveying rollers 138 spans between and is rotatably supported by a pair of side walls (not indicated) and the drive force of a drive means not indicated in the figure, is transmitted to rotate the pair of conveying rollers 138. The PS plate 12 sent from the pair of conveying rollers 118 is inserted between this pair of conveying rollers 138.

Between the pair of conveying rollers 138 and the pair of conveying rollers 118 above the desensitization processing tank 20, are disposed a spray pipe 140 and a guide roller 142 that are similar to the spray pipe 28 and the guide roller 30 disposed in the auxiliary developing tank 14. The spray pipe 140 and the guide roller 142 are connected to one end of a pipe 144. The other end of the pipe 144 passes through the bottom of the desensitization processing tank 20 to protrude into the desensitization processing tank 20. Disposed along this pipe 144 is a circulation pump 146. By the operation of this circulation pump 146, a rinse processing solution or a desensitization processing solution (hereinafter termed the "desensitization processing solution") in the desensitization processing tank 20 is supplied to the spray pipe 140 and the guide roller 142.

Furthermore, one end of a pipe 148 empties into the densensitization processing tank 20 and the other end of the pipe 148 is disposed in the water tank 88. Disposed along the pipe 148 is a water supply pump 150 and the operation of this water supply pump 150 supplies water to the desensitization processing tank 20. Also, one end of a pipe 152 empties into the desensitization processing tank 20 and the other end of the pipe 152 is disposed in a rinse processing solution or desensitization processing solution replenishing tank (hereinafter termed the "desensitization processing solution replenishing tank 154"). Disposed along the pipe 152 is a replenishing pump 156 and the operation of this replenishing pump 156 supplies the desensitization processing solution to the desensitization processing tank 20.

Furthermore, one end of a drainage pipe 158 is open to the bottom of the desensitization processing tank 20 and the other end of this drainage pipe 158 is connected to a drainage tank 160. Located along this drainage pipe 158 is a valve 162 and by opening this valve 162, the desensitization processing solution in the desensitization processing tank 20 can be discharged to the drainage tank 160.

The circulation pump 146 and replenishing pump 156 are connected to and their drive controlled by the control part 108.

The following is a description of the operation of this embodiment of the present invention.

The PS plate 12 upon which an image has been exposed, is inserted to the pair of conveying rollers 22 and then inserted to the pair of conveying rollers 24 of the auxiliary developing tank 14. After insertion to the pair of conveying rollers 24, the PS plate 12 is conveyed in an substantially horizontal direction and guided to the guide roller 30 which inserts it between the pair of conveying rollers 26.

During the time while the PS plate 12 is being conveyed, the spray pipe 28 and the guide roller 30 apply developing solution to both surfaces of the PS plate 12, and developing processing is performed. This developing processing does not completely develop the PS plate 12, and is only performed as auxiliary developing processing.

After it is sent from the pair of conveying rollers 26, the PS plate 12 is guided by the large-diameter guide roller 60 and the guide roller 44 and sent to the main developing tank 16. After the PS plate 12 is sent to the main developing tank 16 it is guided downwards by the guide roller 46, the guide roller 48, the large-diameter guide roller 68 and the guide 72 and sent to the middle part of the main developing tank 16.

The large-diameter guide roller 68 guides the PS plate 12 without allowing the end of the PS plate 12 to be removed from a predetermined conveying path, and the guide 72 operates to insert the end of the PS plate 12 between the conveying rollers 66.

After the PS plates 12 is sent from the pair of conveying rollers 66, it is guided upwards by the guide rollers 50, 52, 54, 56, 58 and 64 and sent from the main developing tank 16.

By being conveyed in this manner, the PS plate 12 is immersed in the developing solution in the main developing tank 16 and undergoes developing processing. The developing processing of the PS plate 12 is completed by the developing in the main developing tank 16.

Because of the developing processing for the PS plate 12, fatigue occurs in the developing solution in the main developing tank 16, but because the PS plate 12 has already undergone the auxiliary developing processing in the auxiliary developing tank 14, the degree of this fatigue of the developing solution in the main developing tank 16 is small.

Because of this, the developing solution in the main developing tank 16 can be used for a long time, and a long running operation is possible.

The surface of the developing solution in the main developing tank 16 is covered by the floating cover 114 which prevents deterioration of the developing solution due to it coming into contact with air.

When the PS plate 12 is conveyed by the pair of conveying rollers 66 in the developing solution in the main developing tank 16, it is squeezed thereby, and then sprayed immediately afterwards with developing solution by the guide roller 50 and the spray pipe 80 so that the developing processing of the PS plate 12 is performed completely. The developing solution in the main developing tank 16 is recirculated by the guide roller 50 and the spray pipe 80.

Moreover, the developing solution that overflows from the main developing tank 16 and is discharged to the overflow solution recovery tank 96 is supplied to the auxiliary developing tank 14 and is thus effectively used for the auxiliary developing processing.

The PS plate 12 sent from the main developing tank 16 is inserted to between the pair of conveying rollers 116 of the washing tank 18 and then sent in an approximately horizontal direction to the upper part of the washing tank 18. After the PS plate 12 is sent by the pair of conveying rollers 116, it is guided by the guide roller 122 and inserted to between the pair of conveying rollers 118.

While the PS plate 12 is being conveyed, both surfaces thereof are sprayed with water by the spray pipe 120 and the guide roller 122 so that any developing solution adhering to the either side of the PS plate 12 is removed.

After the PS plate 12 is sent from the pair of conveying rollers 118, the PS plate 12 is guided by the guide roller 142 and inserted to between the pair of conveying rollers 138. Immediately before the PS plate 12 is inserted to between the pair of conveying rollers 138, desensitization processing solution is sprayed to the both sides by the spray pipe 140 and the guide roller 142. The application of this desensitization processing solution protects the surfaces of the PS plate 12.

Fatigue of the developing solution in the main developing tank 16 occurs when developing processing is performed for the PS plates. The degree of fatigue of the developing solution is detected by detecting the area of the PS plates and then estimated by the control part 108. However, the degree of fatigue of the developing solution changes in accordance with the ratio of image portions to non-image portions of the PS plates (in that the degree of fatigue is greater for greater areas of image portions), and so the fatigue detector 112 detects the degree of electrical conductivity of the developing solution. The results are then used as the basis for the control part 108 to calculate the necessary operating times of the replenishing solution pump 86 and the water supply pump 92, so that the replenishing solution pump 86 and the water supply pump 92 are operated so as to supply development replenishing solution (concentrated) from the development replenishing solution tank 82 and water from the water tank 88 in a constant proportion. However, there are instances where developing solution component deposits or substances dissolving out of the PS plates also adhere to the detector 112 so that an abnormal value for the electrical conductivity is detected by the detector 112. An alarm is given if the abnormal value is given for the difference between the value for the necessary amount of replenishment calculated from the PS plate insertion area calculated by the detector 110, and the value for the necessary amount of replenishment calculated by detector 112 from the impedance of the developing solution. Alternatively, as described below, the replenishing method is changed to that PS plate insertion conducted on the basis of the PS plate insertion area by an automatic or a manual operation.

This is to say that the PS plate insertion area is detected by the detector 110 and the results of detection are used as the basis for calculating the periods of operation of the replenishing solution pump 86 and the water supply pump 92 in the control part 108, so that the replenishing solution pump 86 and the water supply pump 92 are operated so as to supply only the amount of replenishing developing solution necessary for the area of the PS plate 12.

The washing tank 18 is replenished with water by the water supply pump 130, and the desensitization processing tank 20 is refilled in a constant proportion, with desensitization processing solution by the replenishment pump 156, and with water by the water supply pump 150.

The control part 108 controls the supply of the necessary amounts of processing solutions and water to only the amounts in accordance with the area of the PS plate 12.

Moreover, in the embodiment described above, the time required for the processing in the main developing tank 16 can be reduced because of the preliminary processing in the auxiliary developing tank 14.

Embodiment 2

Figure 2:
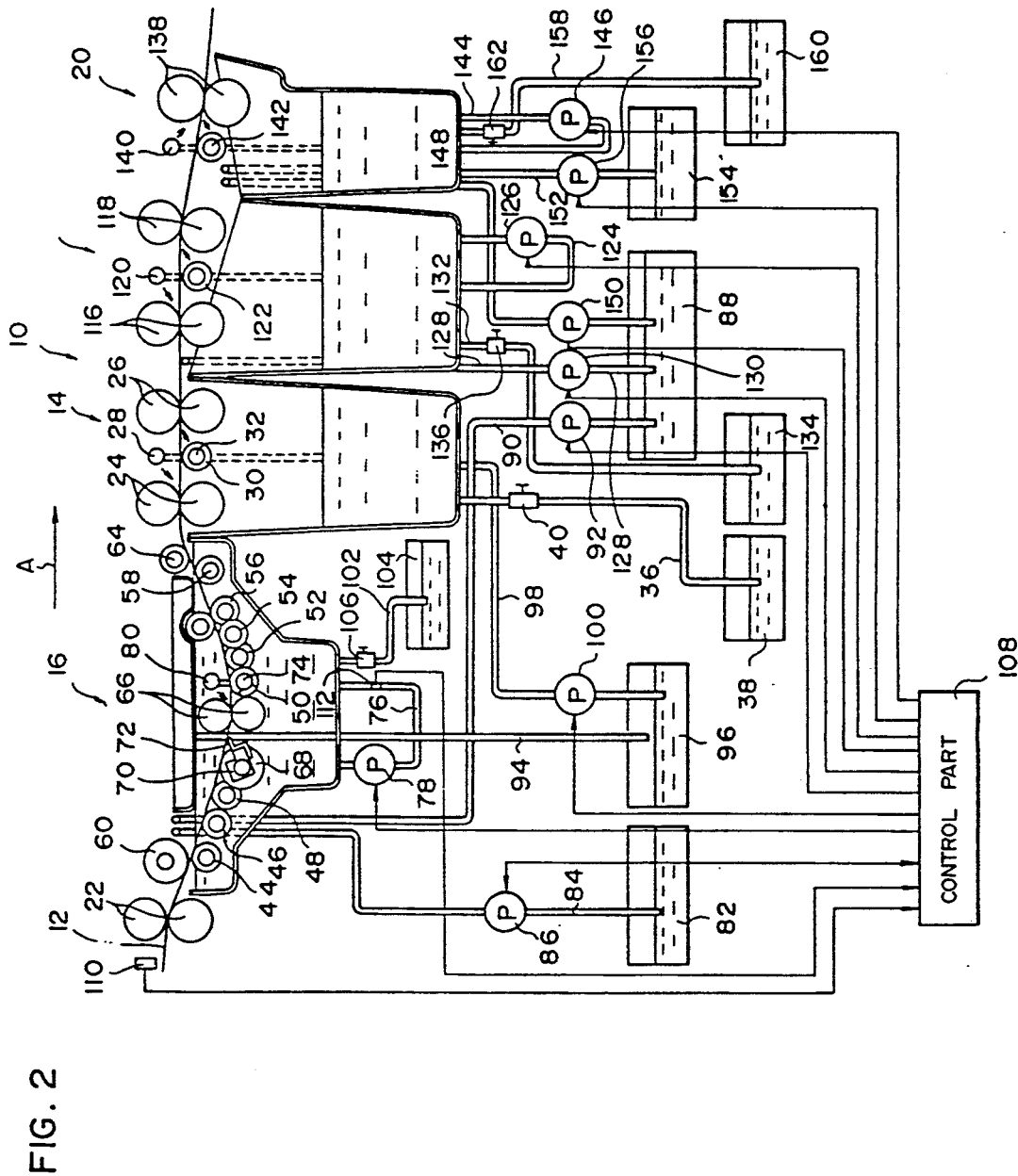
FIG. 2 is a schematic view showing a second embodiment of a photo-sensitive printing plate processing apparatus according to the present invention.

FIG. 2 shows a second embodiment of a photo-sensitive printing plate processing apparatus according to the present invention.

Those parts of this second embodiment that are substantially the same as corresponding parts in the first embodiment are indicated with the same numerals, and the explanation for them is omitted.

As is shown in FIG. 2, in the second embodiment, the auxiliary developing tank 14 is disposed between the main developing tank 16 and the washing tank 18, and in the same manner as in the first embodiment, the developing solution of the main developing tank 16 is supplied to the spray pipe 28 and the guide roller 30 and applied to the PS plate 12 after it is sent from the main developing tank 16.

Accordingly, the PS plate 12 upon which an image has been exposed by an exposure apparatus not indicated in the figure, is inserted between the pair of conveying rollers 22 and then inserted into the main developing tank 16 where it undergoes developing processing. This developing processing almost completely develops the PS plate 12. The PS plate 12 is then sent to the auxiliary developing tank 14 and has developing solution applied by the spray pipe 28 and the guide roller 30 to complete the developing process. By using both the main developing tank 16 and the auxiliary developing tank 14, the degree of fatigue of the developing solution is lessened, and a stable operation is possible for a long period of time irrespective of the type of the PS plate used.

In the above second embodiment the auxiliary developing tank 14 is constituted such that the developing solution of the main tank 16 is supplied to the spray pipe 28 and the guide roller 30 to be applied to the PS plate 12, as described above, but in this invention the auxiliary developing tank 14 may be constituted such that fresh developing solution is supplied to the spray pipe 28 and the guide roller 30 to be applied to the PS plate 12.

Moreover, the first and second embodiments adopt a configuration wherein the developing solution applied to both surfaces of the PS plate 12 by the spray pipe 28 and the guide roller 30 of the auxiliary developing tank 14, is contained in the bottom of the auxiliary developing tank 14, but it is also possible to adopt a configuration such as that used for the main developing tank 16, the washing tank 18 and the desensitization processing tank 20 wherein the developing solution is repeatedly recirculated and used in the auxiliary developing tank 14, and applied to the PS plates.

In the above embodiments the present invention is applied to developing process of the PS plate, but it is also applicable to other photo-sensitive printing plate than the PS plate.

The above embodiments are constituted such that the PS plate 12 which has been immersed in the developing solution of the main developing tank 16 is sent from the main developing tank 16 by the guide roller 64 provided on the outlet side of the main developing tank 16. In this invention, however, a pair of squeezing rollers for squeezing the PS plate 12 may be disposed adjacent to the guide roller 64 on the upstream or downstream side with respect to the direction of conveyance of the PS plate 12 so as to squeeze the developing solution adhering to the PS plate 12 before the PS plate 12 is sent to the sequent processing tank. In this arrangement the developing solution carried from the main developing tank 16 to the sequent processing tank by the PS plate 12 can be reduced largely.

As has been described above, the present invention therefore offers the advantageous effects of enabling the stable developing processing of photo-sensitive printing plates.

What is claimed is:

1. A photo-sensitive printing plate processing apparatus for processing a photo-sensitive printing plate upon which an image has been exposed, comprising:
an immersion type main developing tank to which said photo-sensitive printing plate is conveyed and undergoes developing process, and
an auxiliary developing tank located adjacent to said immersion type main developing tank on either the upstream side or the downstream side with respect to the direction of conveyance of said photo-sensitive printing plate, for auxiliary developing of said photo-sensitive printing plate;
wherein development replenishing solution in a development replenishing solution tank is supplied to said immersion type main developing tank, and overflow of developing solution from said immersion type main developing tank is collected and transferred to said auxiliary developing tank; and
wherein said auxiliary developing tank is provided with an application means for applying developing solution to said photo-sensitive printing plate; and wherein said application means is provided with a spray means for spraying the developing solution to said photo-sensitive printing plate.

2. A photo-sensitive printing plate processing apparatus according to claim 1, wherein the spray means comprises a spray pipe having spray outlets for spraying the developing solution provided at regular intervals along its length, and wherein said spray pipe is disposed so that its length crosses the conveyor path of the photo-sensitive printing plate.

3. A photo-sensitive printing plate processing apparatus for processing a photo-sensitive printing plate upon which an image has been exposed, comprising:
- an immersion type main developing tank to which said photo-sensitive printing plate is conveyed and undergoes developing processing; and
- an auxiliary developing tank located adjacent to said immersion type main developing tank on either the upstream side or the downstream side with respect to the direction of conveyance of said photo-sensitive printing plate, for auxiliary developing of said photo-sensitive printing plate; wherein
- said auxiliary tank is provided with an application means for applying developing solution to said photo sensitive printing plate;
- said application means is provided with a spray means for spraying the developing solution to said photo-sensitive printing plate;
- said spray means comprises a spray pipe having spray outlets for spraying the developing solution provided at regular intervals along its length, and said spray pipe is disposed so that its length crosses a conveyor path of the photo-sensitive printing plate; and wherein said spray pipe faces each side of said photo-sensitive printing plate.

4. A photo-sensitive printing plate processing apparatus according to claim 3, wherein the photo-sensitive printing plate is conveyed between an upper spray pipe and a lower spray pipe provided with support rollers disposed among spray nozzles said support rollers being in contact with lower surfaces of the photo-sensitive printing plate.

5. A photo-sensitive printing plate developing apparatus for processing a photo-sensitive printing plate upon which an image has been exposed, comprising:
- an immersion type main developing tank to which said photo-sensitive printing plate is conveyed and undergoes developing processing;
- an auxiliary developing tank located adjacent to said immersion type main developing tank on either the upstream side or the downstream side with respect to the direction of conveyance of said photo-sensitive printing plate, for auxiliary developing of said photo-sensitive printing plate;
- wherein development replenishing solution in a development replenishing solution tank is supplied to said immersion type main developing tank and developing solution guide means by which developing solution contained in said immersion type main developing tank is guided to said auxiliary developing tank for performing the auxiliary developing, and;
- wherein said developing solution guide means is provided with collection means for collecting overflow of developer solution from said main developing tank, and liquid conveying means transferring the collected developing solution to said auxiliary developing tank.

6. A photo-sensitive printing plate processing apparatus for processing with a processing solution a photo-sensitive printing plate upon which an image has been exposed, comprising:
- a main developing tank containing developing solution in which the photo-sensitive printing plate is conveyed and developed in the developing solution by immersion, and;
- an auxiliary developing tank located adjacent to said immersion type main developing tank on the upstream side with respect to the direction of conveyance of said photo-sensitive printing plate, in which the developing solution is applied to said photo-sensitive printing plate for preliminary developing of said photo-sensitive printing plate;
- wherein development replenishing solution in a development replenishing solution tank is supplied to said immersion type main development tank, and overflow of developing solution from said immersion type main developing tank is collected and transferred to said auxiliary development tank; and
- wherein said auxiliary developing tank is preliminarily provided with an application means for applying the developing solution to said photo-sensitive printing plate; and
- wherein said application means is provided with a spray means for spraying the developing solution to the surface of the photo-sensitive printing plate.

7. A photo-sensitive printing plate processing apparatus according to claim 6, wherein the spray means comprises a spray pipe having spray nozzles for spraying the developing solution provided at regular intervals along its lengths, and wherein the spray pipe is disposed so that its length crosses the conveyor path or the photo-sensitive printing plate.

8. A photo-sensitive printing plate processing apparatus according to claim 6, further comprising a developing solution guide means by which developing solution contained in the main developing tank is guided to said spray means to spray the developing solution onto the photo-sensitive plate.

9. A photo-sensitive printing plate processing apparatus according to claim 8, wherein the developing solution guide means is provided with collection means for collecting the developing solution from the upper part of the developing solution in the main developing tank, and liquid conveying means transferring collected developing solution to the spray means.

10. A photo-sensitive printing plate processing apparatus for processing with a developing solution a photo-sensitive printing plate upon which an image has been exposed, comprising:
- a main developing tank containing the developing solution in which said photo-sensitive printing plate is conveyed and immersed in the developing solution to undergo developing process, and;
- an auxiliary developing tank located adjacent to said main developing tank on the downstream with respect to the direction of conveyance of said photo-sensitive printing plate, in which the developing solution is applied to said photo-sensitive printing plate for auxiliary developing of said photo-sensitive printing plate;
- wherein development replenishing solution in a development replenishing solution tank is supplied to said main developing tank, and overflow of developing solution from said main developing tank is collected and transferred to said auxiliary development tank; and, wherein said auxiliary developing tank is provided with an application means for applying the developing solution to said photo-sensitive printing plate; and, wherein said application means is provided with a spray means for spraying the developing solution to the surface of said photo-sensitive printing plate.

11. A photo-sensitive printing plate processing apparatus according to claim 10, wherein the spray means comprises a spray pipe having spray nozzles for spraying the developing solution provided at regular intervals along its length and wherein this spray pipe is disposed so that its length crosses the conveying path of the photo-sensitive printing plate.

* * * * *